(12) United States Patent
Zhou et al.

(10) Patent No.: US 11,527,487 B2
(45) Date of Patent: Dec. 13, 2022

(54) PACKAGE STRUCTURE AND METHOD OF MANUFACTURING THE SAME

(71) Applicant: LUXSHARE ELECTRONIC TECHNOLOGY (KUNSHAN) LTD., Kunshan (CN)

(72) Inventors: Xiaolei Zhou, Kunshan (CN); Wenbin Kang, Kunshan (CN); Peng Liu, Kunshan (CN)

(73) Assignee: LUXSHARE ELECTRONIC TECHNOLOGY (KUNSHAN) LTD., Kunshan (CN)

( * ) Notice: Subject to any disclaimer, the term of this patent is extended or adjusted under 35 U.S.C. 154(b) by 0 days.

(21) Appl. No.: 17/167,517

(22) Filed: Feb. 4, 2021

(65) Prior Publication Data
US 2022/0020699 A1 Jan. 20, 2022

(30) Foreign Application Priority Data
Jul. 14, 2020 (CN) .......................... 202010677100.3

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/4857* (2013.01);
(Continued)

(58) Field of Classification Search
CPC ............. H01L 21/4853; H01L 21/4857; H01L 21/565; H01L 21/56; H01L 23/49816;
(Continued)

(56) References Cited

U.S. PATENT DOCUMENTS

| 9,691,711 B2 | 6/2017 | Mahajan et al. |
| 10,937,753 B1 * | 3/2021 | Kariyazaki .............. G11C 5/06 |

(Continued)

FOREIGN PATENT DOCUMENTS

| CN | 107104094 A | 8/2017 |
| CN | 110707072 A | 1/2020 |

*Primary Examiner* — Kyoung Lee
*Assistant Examiner* — Christina A Sylvia
(74) *Attorney, Agent, or Firm* — Birch, Stewart, Kolasch & Birch, LLP

(57) ABSTRACT

The invention provides a package structure, comprising: a substrate disposed with a solid grounded copper layer; at least two radio frequency chip modules disposed on the substrate; a plastic encapsulation disposed on the substrate, covered on a surface of the substrate, and coating the at least two radio frequency chip modules therein; a groove located between the adjacent two radio frequency chip modules, and penetrating an upper surface and a lower surface of the plastic encapsulation; a solder filling body filled in the groove, wherein an upper surface of the solder filling body is flushed with the upper surface of the plastic encapsulation; and a shielding layer covered on the upper surface and lateral surfaces of the plastic encapsulation, an upper surface of the solder filling body and lateral surfaces of the substrate; wherein a position of the solid grounded copper layer corresponds to a position of the groove, and makes contact with the solder filling body in the groove.

12 Claims, 16 Drawing Sheets

(51) Int. Cl.
*H01L 21/56* (2006.01)
*H01L 23/31* (2006.01)
*H01L 23/538* (2006.01)
*H01L 23/00* (2006.01)
*H01L 25/065* (2006.01)
*H01L 25/00* (2006.01)

(52) U.S. Cl.
CPC ........ *H01L 21/565* (2013.01); *H01L 23/3128* (2013.01); *H01L 23/5383* (2013.01); *H01L 23/5386* (2013.01); *H01L 24/16* (2013.01); *H01L 25/0652* (2013.01); *H01L 25/0655* (2013.01); *H01L 25/50* (2013.01); *H01L 2224/16225* (2013.01); *H01L 2225/06517* (2013.01); *H01L 2225/06537* (2013.01); *H01L 2924/15311* (2013.01); *H01L 2924/3025* (2013.01)

(58) Field of Classification Search
CPC ............... H01L 23/552; H01L 23/5383; H01L 23/5386; H01L 25/0652; H01L 25/0655; H01L 25/50; H01L 25/18; H01L 24/16; H01L 2224/16227; H01L 2225/06517; H01L 2225/06537; H01L 2924/15311; H01L 2924/3025; H01L 2924/1815

See application file for complete search history.

(56) References Cited

U.S. PATENT DOCUMENTS

| | | | |
|---|---|---|---|
| 2007/0008051 A1* | 1/2007 | Tsuda | H03H 9/1085 333/193 |
| 2013/0105973 A1* | 5/2013 | Gan | H01L 23/48 257/E23.021 |
| 2017/0092618 A1* | 3/2017 | Huitink | H01L 23/3157 |
| 2018/0374798 A1* | 12/2018 | Lee | H01L 23/49811 |
| 2019/0388055 A1* | 12/2019 | Minas | A61B 8/12 |

* cited by examiner

PACKAGE STRUCTURE AND METHOD OF MANUFACTURING THE SAME

CROSS-REFERENCE TO RELATED APPLICATIONS

This non-provisional application claims priority under 35 U.S.C. § 119(a) on Patent Application No. 202010677100.3 filed in P.R. China on Jul. 14, 2020, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

BACKGROUND OF THE INVENTION

1. Field of the Invention

The invention relates to the field of package of integrated circuits, and particularly to a package structure of an electromagnetic interference shielding system.

2. Related Art

In the process of manufacturing electronic System In Package (SiP), with miniaturization of package dimensions, it is required that a digital circuit, an analog circuit and a radio frequency circuit are integrated in a system, and different chips in the system are cooperated and combined. When the chips are too close, interference occurs, and in particular, for high frequency analog chips, reliability is often suffered from electromagnetic interference. Currently, it is urgent to develop a package structure for shielding electromagnetic interference, and adapted to tendency of miniaturization of product development.

SUMMARY OF THE INVENTION

One embodiment of the invention provides a package structure, comprising: a substrate, at least two radio frequency chip modules, a plastic encapsulation, a groove, a solder filling body and a shielding layer.

The substrate disposed with a solid grounded copper layer; at least two radio frequency chip modules disposed on the substrate; the plastic encapsulation disposed on the substrate, covered on a surface of the substrate, and at least the two radio frequency chip modules are coated; the groove located between the adjacent two radio frequency chip modules, and penetrating an upper surface and a lower surface of the plastic encapsulation; the solder filling body filled in the groove, wherein an upper surface of the solder filling body is flushed with the upper surface of the plastic encapsulation; and the shielding layer covered on the upper surface and lateral surfaces of the plastic encapsulation, an upper surface of the solder filling body and lateral surfaces of the substrate; wherein a position of the solid grounded copper layer corresponds to a position of the groove, and makes contact with the solder filling body within the groove.

One embodiment of the invention further provides a method of manufacturing a package structure, comprising: providing a substrate where at least two radio frequency chip modules are disposed on a surface and a solid grounded copper layer is disposed on a surface layer; forming a plastic encapsulation on the substrate to coat the at least two radio frequency chip modules therein; removing the plastic encapsulation between the adjacent two radio frequency chip modules to form a groove, the groove penetrating an upper surface and a lower surface of the plastic encapsulation, and a bottom surface of the groove corresponding to the solid grounded copper layer; filling a solder filling body in the groove, and making contact with the solid grounded copper layer; and forming a shielding layer on the upper surface and lateral surfaces of the plastic encapsulation, an upper surface of the solder filling body and lateral surfaces of the substrate.

In the package structure and the method of manufacturing the same, the substrate is made of a rigid organic laminated multilayer sheet material, and has multiple metal circuit layers and a complete ground plane layer.

In the package structure and the method of manufacturing the same, the metal circuit layers of the substrate are laminated ten to twelve layers.

In the package structure and the method of manufacturing the same, the plastic encapsulation is made of an insulated thermosetting material with a relatively low viscosity.

In the package structure and the method of manufacturing the same, the solid grounded copper layer is made of copper, the solder filling body is made of a silver-based material, and a contact portion there forms a metal separating wall.

In the package structure and the method of manufacturing the same, the groove comprises a groove top surface, a groove wall surface and a groove bottom surface.

In the package structure and the method of manufacturing the same, a width of the solid grounded copper layer is greater than or equal to 100 μm, a width of the groove bottom surface is greater than or equal to 50 μm, a width of the groove top surface is three to six times of the width of the groove bottom surface, and a ratio of a depth of the groove wall surface to a depth of the groove is greater than or equal to 50%.

In the package structure and the method of manufacturing the same, the upper surface of the plastic encapsulation is flushed with the upper surface of the solder filling body.

In the package structure and the method of manufacturing the same, a thickness of the shielding layer is 2 to 10 μm.

In the package structure and the method of manufacturing the same, it further comprises a communication chip module disposed on the substrate.

In the package structure and the method of manufacturing the same, a height of the communication chip module is less than or equal to 200 μm.

In the package structure and the method of manufacturing the same, the communication chip module is located on a different side of the substrate opposite to the at least two radio frequency chip modules, and attached to the substrate through a plurality of micro-solder balls.

In the package structure and the method of manufacturing the same, the communication chip module and the at least two radio frequency chip modules are located on the same side of the substrate, and directly attached to the substrate, and the communication chip module is not coated by the plastic encapsulation.

In the package structure and the method of manufacturing the same, it further comprises a plurality of solder balls disposed on the substrate, and located on a different side of the substrate opposite to the at least two radio frequency chip modules.

Advantageous effects of the invention lie in that since the package structure having electromagnetic interference shielding function is derived on the basis of traditional reliable injection molding package structure, and the laser grooving process on the plastic encapsulation surface is mature and has high accuracy, a width of the groove can be less than 80 μm without adhering specific isolation objects, while generally, a dimension of the isolation object is 200 μm, so layout of shielding and package of the package structure provided in the invention is flexible, and a unit area can realize more functions of the components, thereby facilitating miniaturization and microminiaturization of dimension of the system-level package structure.

Hereinafter the invention is described in detail with reference to the accompanying drawings and the detailed embodiments, but the invention is not limited thereto.

DETAILED EMBODIMENTS OF THE INVENTION

Figure 1:
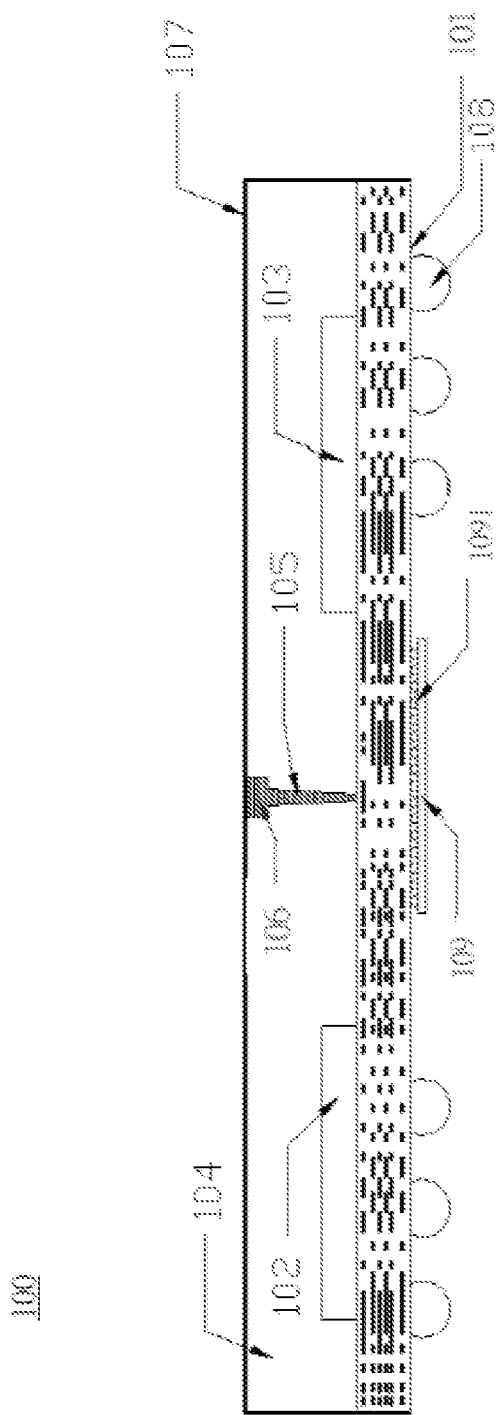
FIG. 1 is a structural diagram illustrating a local section of a package structure provided in one embodiment of the invention.
Figure 2A:
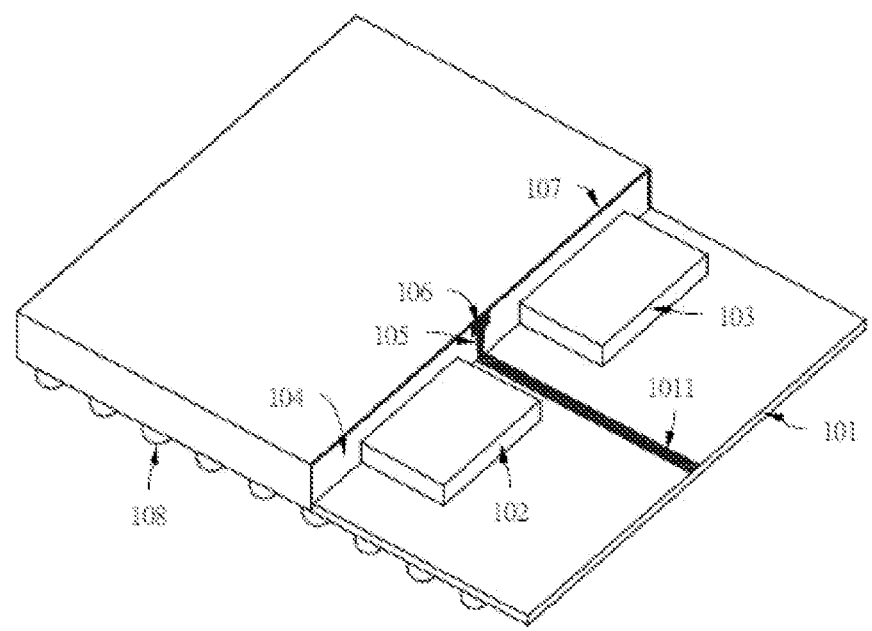
FIGS. 2A and 2B are perspective structural diagrams of the package structure provided in one embodiment of the invention.
Figure 2B:
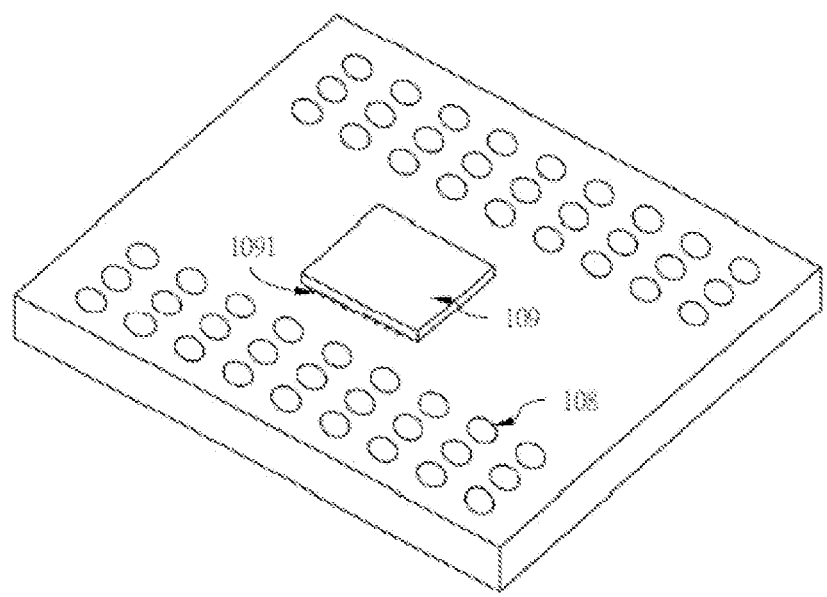
Figure 3:
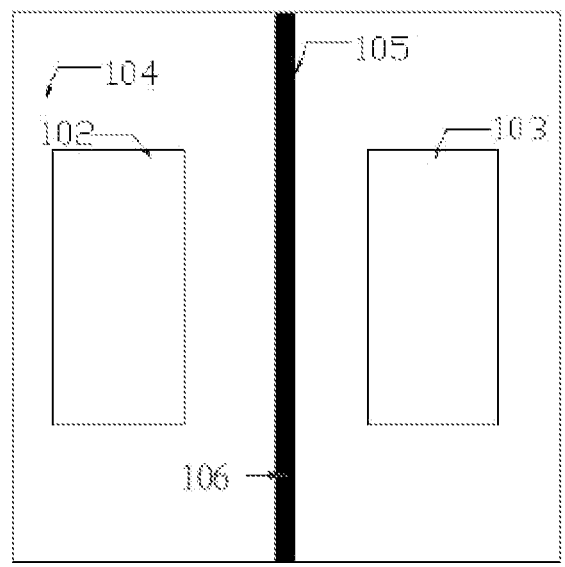
FIG. 3 is a top diagram of the package structure provided in one embodiment of the invention.

Hereinafter structural principle and working principle of the invention are described in detail with reference to the accompanying drawings:

FIG. 1 is a structural diagram illustrating a local section of a package structure provided in one embodiment of the invention, FIGS. 2A and 2B are perspective structural diagrams of the package structure provided in one embodiment of the invention, and FIG. 3 is a top diagram of the package structure provided in one embodiment of the invention.

As shown in FIGS. 1, 2A-2B and 3, one embodiment of the invention provides a package structure 100, comprising: a substrate 101 disposed with a solid grounded copper layer 1011; a radio frequency chip module 102 and a radio frequency chip module 103 disposed on the substrate 101; a plastic encapsulation 104 disposed on the substrate 101, covered on a surface of the substrate 101, and coating the radio frequency chip module 102 and the radio frequency chip module 103 therein; a groove 105 located between the radio frequency chip module 102 and the radio frequency chip module 103, and penetrating an upper surface and a lower surface of the plastic encapsulation 104; a solder filling body 106 filled in the groove 105, wherein an upper surface of the solder filling body 106 is flushed with the upper surface of the plastic encapsulation 104; and a shielding layer 107 covered on the upper surface and lateral surfaces of the plastic encapsulation 104, an upper surface of the solder filling body 106 and lateral surfaces of the substrate 101; wherein a position of the solid grounded copper layer 1011 corresponds to a position of the groove 105, and makes contact with the solder filling body 106 in the groove 105.

The substrate 101 is designed to have multiple metal circuit layers and a complete ground plane layer to facilitate separating signal interference of a vertical plane. The solid grounded copper layer 1011 is disposed on a surface layer of the substrate 101, and is made of copper, for the purpose of making contact with the solder filling body 106 to form a metal separating wall. Alternatively, an upper surface of the solid grounded copper layer 1011 can be covered with a solder mask for insulation protection, or is directly electroplated for protection, or protected by an anti-oxidation film to prevent the copper layer from being exposed and oxidized when the substrate is processed. The substrate 101 is selected from a rigid organic laminated multilayer sheet material, and the metal layers of the substrate 101 are laminated ten to twelve layers.

The radio frequency chip module 102 and the radio frequency chip module 103 are gold wire bonded and welded to the substrate 101 through a flip-chip welding technology or a surface mounted technology.

The plastic encapsulation 104 is formed after thermoplastic curing a plastic encapsulation material on an entire surface of the substrate 101 through a plastic encapsulation technology. Alternatively, the plastic encapsulation material forming the plastic encapsulation 104 is selected from an insulated thermosetting material with a relatively low viscosity.

The groove 105 is formed on the plastic encapsulation 104 between the radio frequency chip module 102 and the radio frequency chip module 103 through a laser technology, and penetrates the upper surface and the lower surface of the plastic encapsulation 104.

A solder filling material is filled in the groove 105 to form the solder filling body 106. Specifically, an upper surface of the solder filling body 106 is flushed with the upper surface of the plastic encapsulation 104, so as to facilitate flatness of the shielding layer 107 formed subsequently. Alternatively, the main component of the solder filling body 106 is a silver powder shielding material, such that a contact portion of the solder filling body 106 and the solid grounded copper layer 1011 can form an alloy, i.e., the silver powder shielding material is bonded with the copper material to form an alloy, so a position of the solder filling body 106 corresponding to a position of the solid grounded copper layer 1011 shall be satisfied.

A shielding layer 107 is formed on the upper surface and lateral surfaces of the plastic encapsulation 104, an upper surface of the solder filling body 106 and lateral surfaces of the substrate 101 through a sputtering technology. Alternatively, the shielding layer 107 is made of a metal material, and has a thickness of 2 to 10 μm.

In the package structure 100 provided in this embodiment, the solid grounded copper layer 1011 on the surface layer of the substrate 101 is electrically connected to the shielding layer 107 through the solder filling body 106, thereby packaging the substrate 101, and the solid grounded copper layer 1011, the solder filling body 106 and the shielding layer 107 are bonded together to form a relatively enclosed shielding cavity as a whole, which functions to shield electromagnetic interference between the radio frequency chip module 102, the radio frequency chip module 103 and external electronic elements. Meanwhile, the groove 105 is located between the radio frequency chip module 102 and the radio frequency chip module 103, and filled with the solder filling body 106 for shielding electromagnetic interference between the radio frequency chip module 102 and the radio frequency chip module 103.

Preferably, the package structure 100 further comprises a communication chip module 109. In this embodiment, the communication chip module 109 is attached to the substrate 101. Specifically, the communication chip module 109 is located on another surface of the substrate 101, i.e., a different surface of the substrate 101 opposite to the radio frequency chip module 102 and the radio frequency chip module 103, and the communication chip module 109 is disposed on the substrate 101 through micro-solder balls 1091 using interconnection of flip-chip welding or surface mounted welding. Meanwhile, a height of the communication chip module 109 is less than or equal to 200 μm.

Preferably, the package structure 100 further comprises a plurality of solder balls 108. In this embodiment, the plurality of solder balls 108 are disposed on the surface of the substrate 101 through a bumping technology to form an interconnected interface, and also on another surface of the substrate 101, i.e., the different surface of the substrate 101 opposite to the radio frequency chip module 102 and the radio frequency chip module 103. Please refer to FIG. 2B, the plurality of solder balls 108 are disposed on both sides of the communication chip module 109, and a height of the solder balls 108 is at least 50 μm greater than the height of the communication chip module 109.

Figure 4:
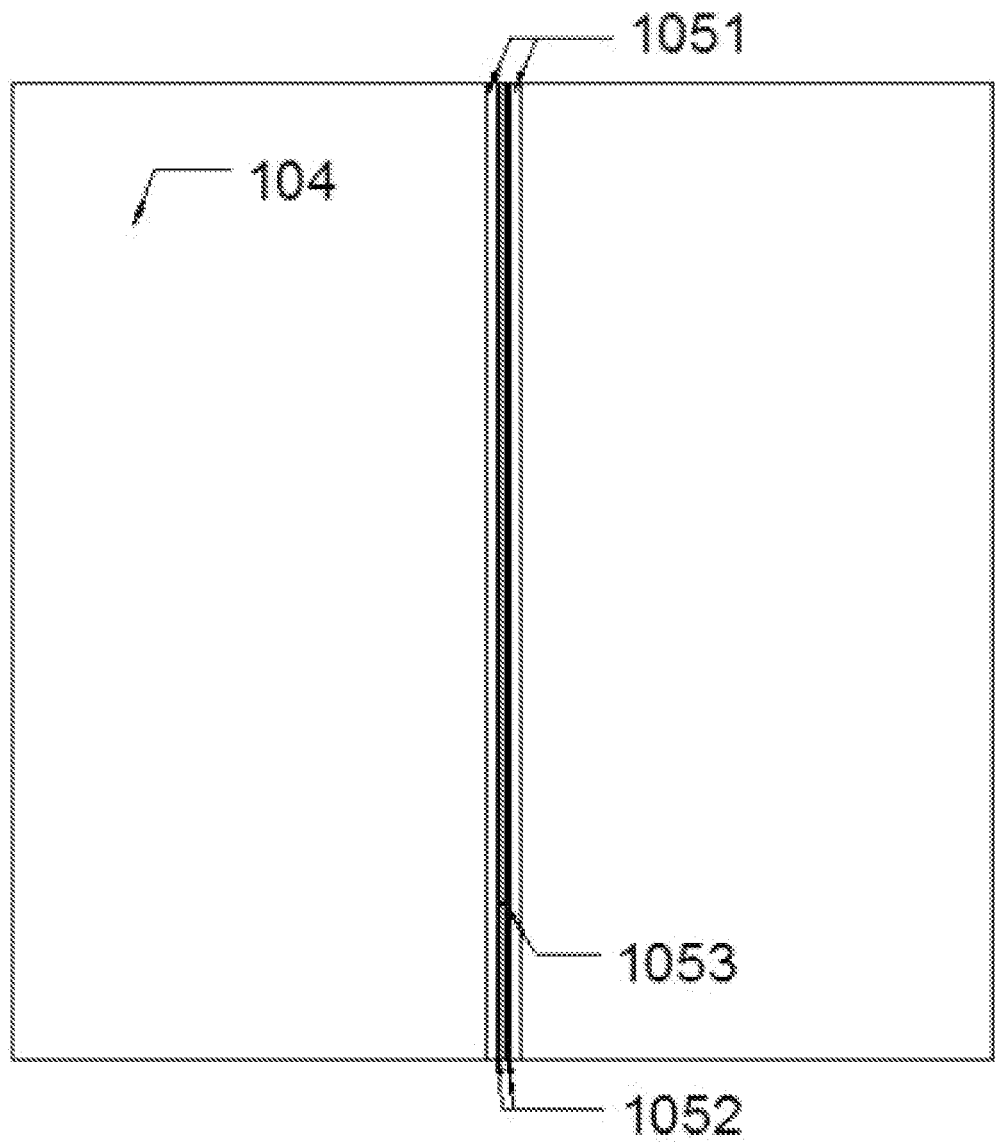
FIG. 4 is a top structural diagram illustrating a groove of the package structure provided in one embodiment of the invention.
Figure 5:
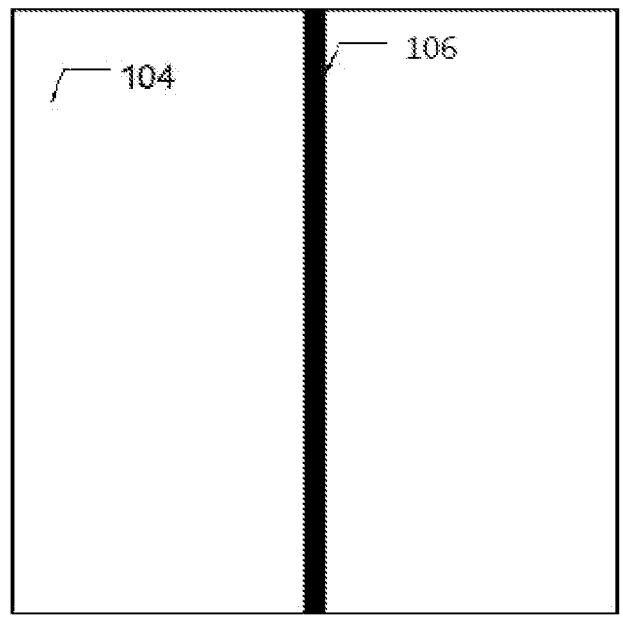
FIG. 5 is a top diagram illustrating a solder filling body of the package structure provided in one embodiment of the invention.
Figure 6:
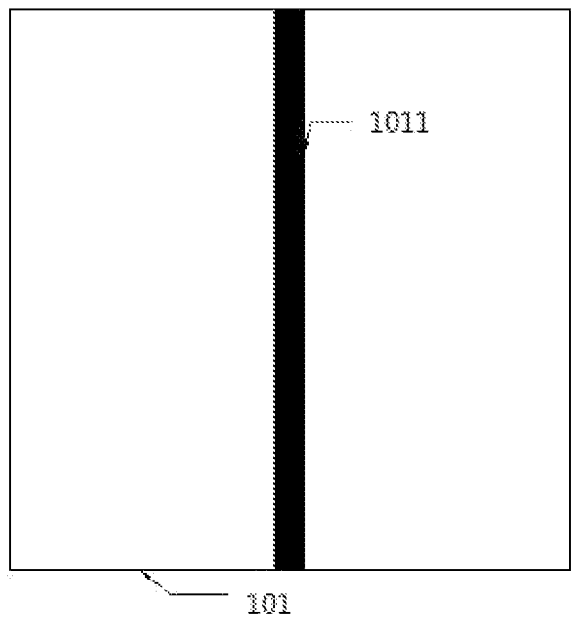
FIG. 6 is a top diagram illustrating a solid grounded copper layer of a substrate of the package structure provided in one embodiment of the invention.

FIG. 4 is a top structural diagram illustrating a groove of the package structure provided in one embodiment of the invention, FIG. 5 is a top diagram illustrating a solder filling body of the package structure provided in one embodiment of the invention, and FIG. 6 is a top diagram illustrating a solid grounded copper layer of a substrate of the package structure provided in one embodiment of the invention.

As shown in FIG. 4, in this embodiment, the groove 105 is formed of a groove top surface 1051, a groove wall surface 1052 and a groove bottom surface 1053. Specifically, the relatively wide groove top surface 1051 with a certain depth is formed at a specified position of the plastic encapsulation 104, i.e., between the radio frequency chip module 102 and the radio frequency chip module 103 through the laser technology, then the gradually narrowed groove wall surface 1052 is continued to be formed downwardly, and finally, the groove bottom surface 1053 is formed after reaching the solid grounded copper layer 1011 on the surface layer of the substrate 101. Specifically, a width of the groove bottom surface 1053 is designed to be greater than or equal to 50 μm, and a width of the groove bottom surface 1053 is at least 50 μm less than a width of the solid grounded copper layer 1011. That is, correspondingly, the width of the solid grounded copper layer 1011 shall be designed to be greater than or equal to 100 μm, a width of the groove top surface 1051 is designed to be three to six times of the width of the groove bottom surface 1053, and a depth of the groove wall surface 1052 is designed to be 50% or more of a depth of the whole groove 105.

As shown in FIG. 5, the solder filling material is filled in the groove 105 to form the solder filling body 106, a starting point and an end point of the groove 105 are respectively located on two opposite lateral sides of the plastic encapsulation 104, such that the groove 105 is in an "I" shape, and a shape of the solder filling body 106 is defined by the groove 105, and also in an "I" shape. Please also refer to FIG. 3, the groove 105 and the solder filling body 106 are located on the plastic encapsulation 104 between the radio frequency chip module 102 and the radio frequency chip module 103, such that the radio frequency chip module 102 and the radio frequency chip module 103 are separated.

As shown in FIG. 6, in this embodiment, the solid grounded copper layer 1011 is disposed on the surface layer of the substrate 101, a position of the solid grounded copper layer 1011 corresponds to a position of the solder filling body 106, and the solder filling body 106 is located in the groove 105, so the position of the solid grounded copper layer 1011 corresponds to a bottom surface of the groove 105. Specifically, please also refer to FIG. 4, the position of the solid grounded copper layer 1011 corresponds to the groove bottom surface 1053, and the width of the solid grounded copper layer 1011 is greater than the width of the groove bottom surface 1053. In other words, the groove bottom surface 1053 is situated on the solid grounded copper layer 1011, such that the solid grounded copper layer 1011 makes contact with the solder filling body 106 to form a metal separating wall.

Figure 7:
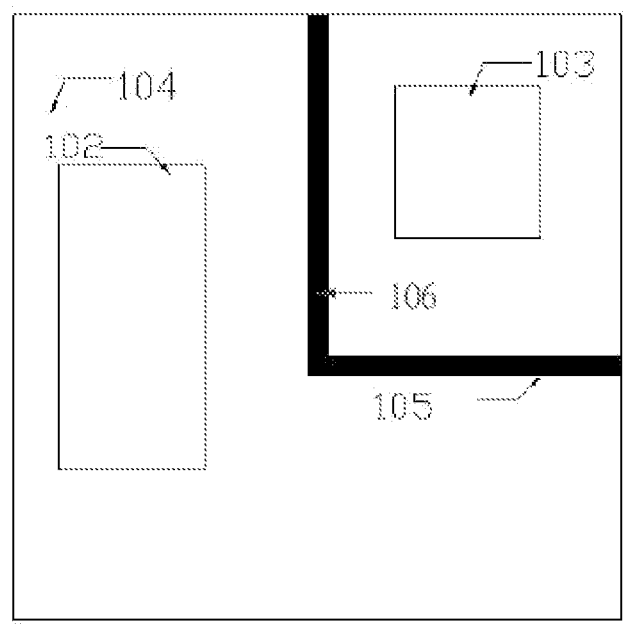
FIG. 7 is a top diagram of another package structure provided in one embodiment of the invention.

FIG. 7 is a top diagram of another package structure provided in one embodiment of the invention.

As shown in FIG. 7, the groove 105 penetrates an upper surface and a lower surface of the plastic encapsulation 104 and disposed between the radio frequency chip module 102 and the radio frequency chip module 103, and the plastic encapsulation 106 is disposed in the groove 105, thereby functioning to separate the radio frequency chip module 102 from the radio frequency chip module 103, and shield electromagnetic interference therebetween. Specifically, positions of the groove 105 and the plastic encapsulation 106 on the plastic encapsulation 104 may be determined depending on positions of actually packaged electronic elements. In this embodiment, the starting point and the end point of the groove 105 are respectively located on two interconnected lateral sides of the plastic encapsulation 104, such that the groove 105 is in a "└" shape, and a shape of the solder filling body 106 is defined by the groove 105, and also in a "└" shape.

Figure 8:
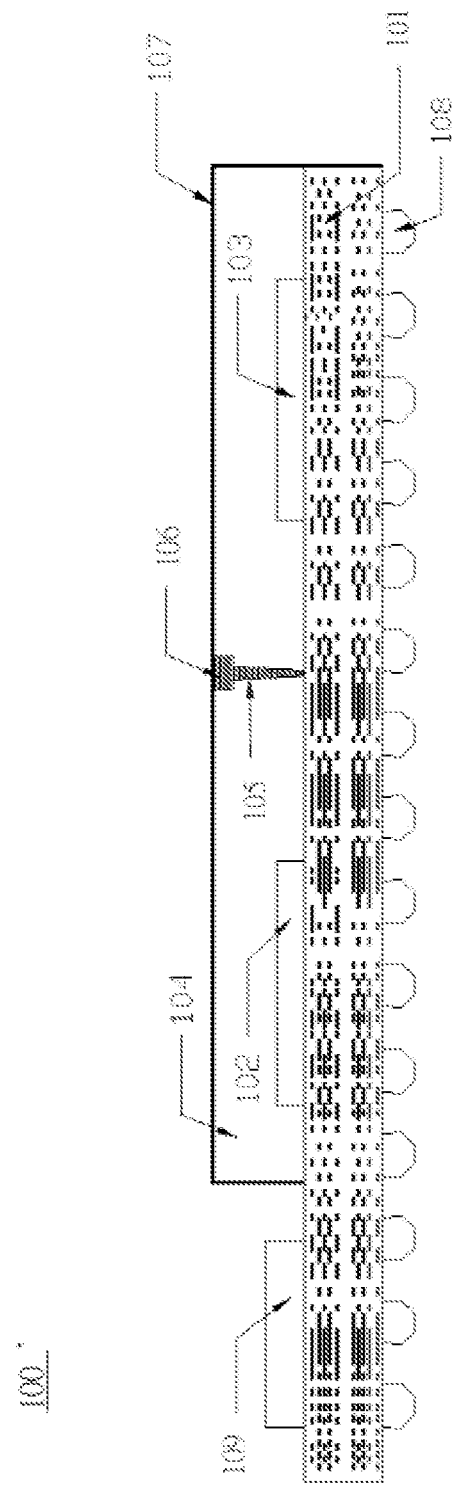
FIG. 8 is a structural diagram illustrating a local section of another package structure provided in one embodiment of the invention.
Figure 9A:
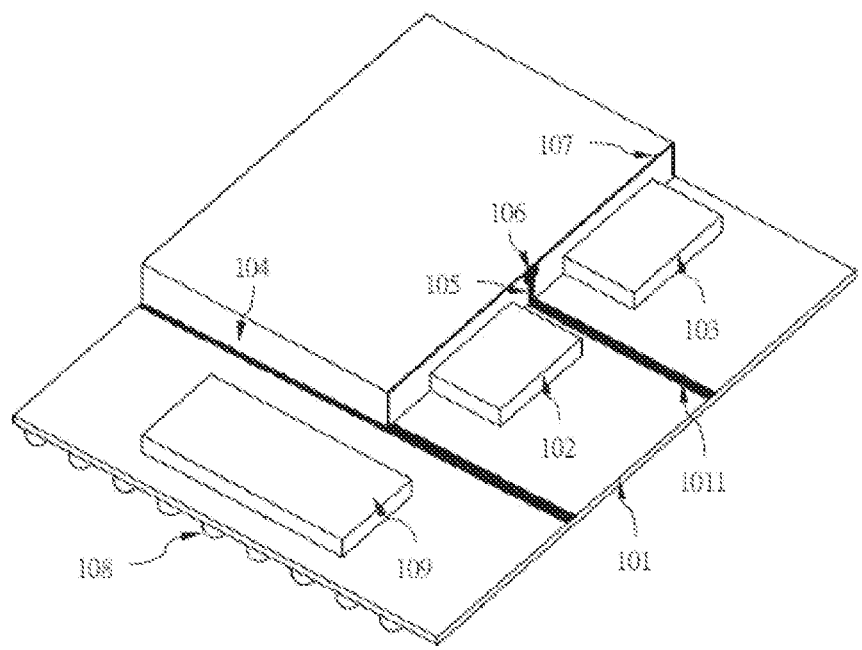
FIGS. 9A and 9B are perspective structural diagrams of another package structure provided in one embodiment of the invention.
Figure 9B:
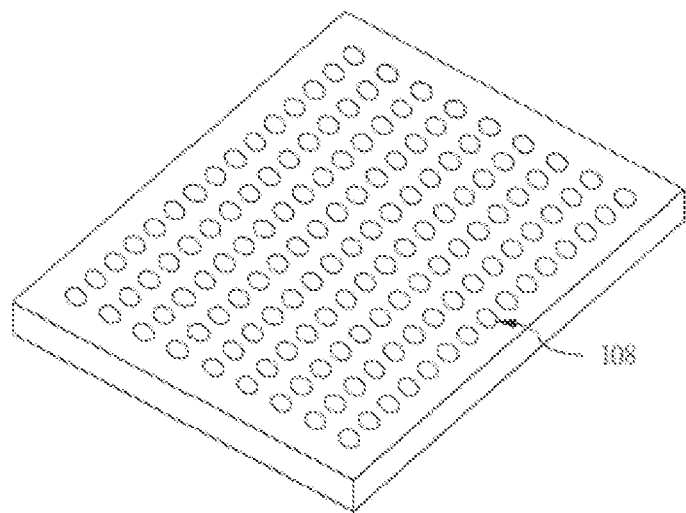
Figure 10:
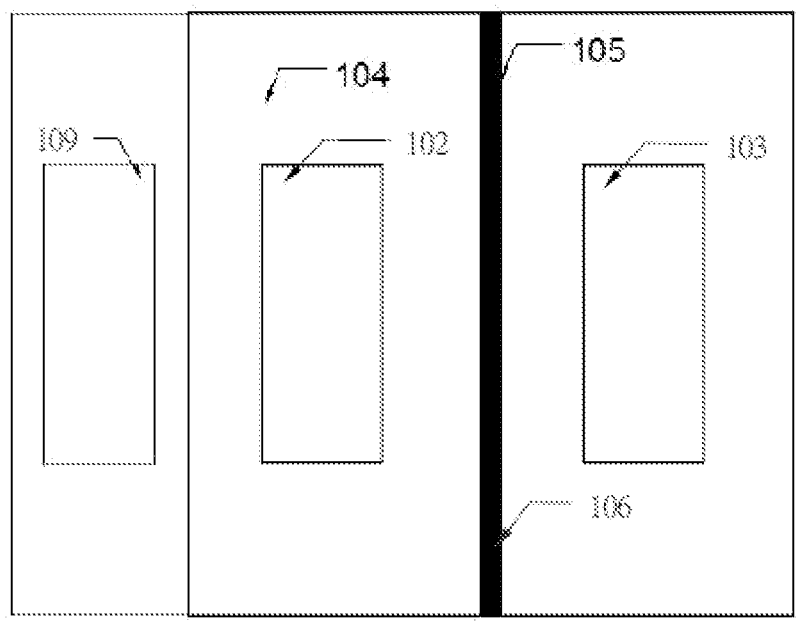
FIG. 10 is a top diagram of another package structure provided in one embodiment of the invention.

FIG. 8 is a structural diagram illustrating a local section of another package structure provided in one embodiment of the invention, FIGS. 9A and 9B are perspective structural diagrams of the package structure provided in one embodiment of the invention, and FIG. 10 is a top diagram of the package structure provided in one embodiment of the invention.

Difference between a package structure 100' shown in FIGS. 8, 9A, 9B and 10 and the package structure 100 shown in FIGS. 1, 2A, 2B and 3 only lies in different positions of the communication chip module 109 on the substrate 101, and other portions are consistent. In this embodiment, the communication chip module 109 is directly attached to a surface of the substrate 101. Specifically, the communication chip module 109, the radio frequency chip module 102 and the radio frequency chip module 103 are on the same lateral surface of the substrate 101, and the communication chip module 109 is not coated by the plastic encapsulation 104. The plurality of solder balls 108 are disposed on another surface of the substrate 101, i.e., a different surface of the substrate 101 opposite to the radio frequency chip module 102 from the radio frequency chip module 103, and the plurality of solder balls 108 are evenly arranged on the surface.

Figure 11:
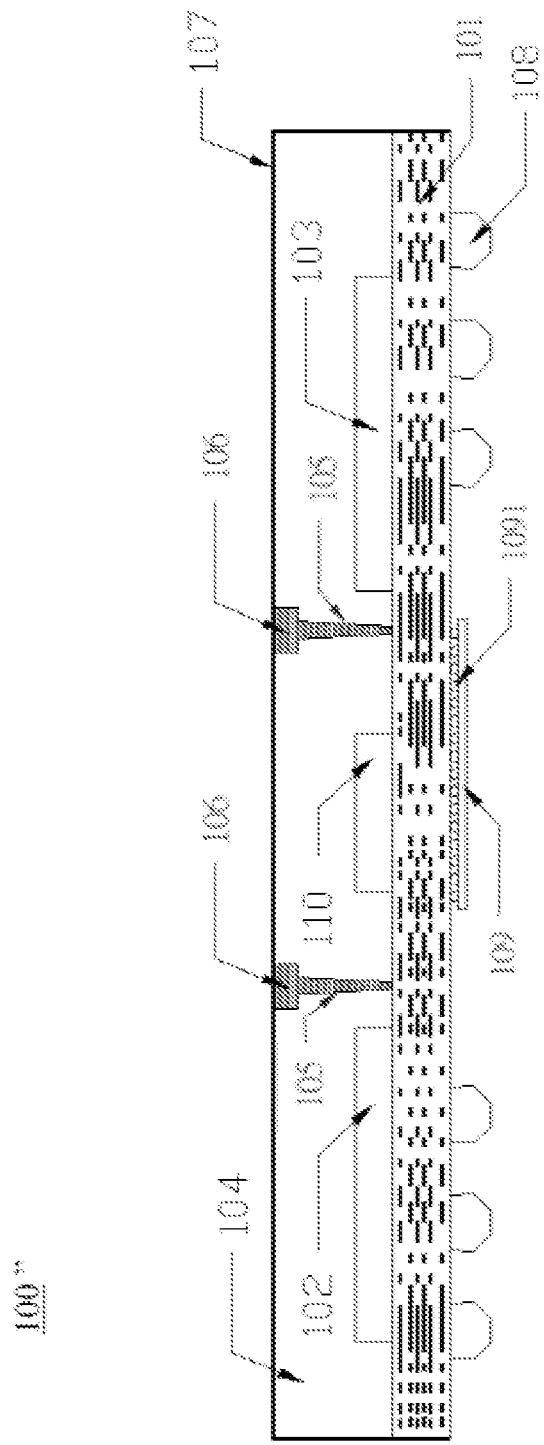
FIG. 11 is a structural diagram illustrating a local section of still another package structure provided in one embodiment of the invention.
Figure 12A:
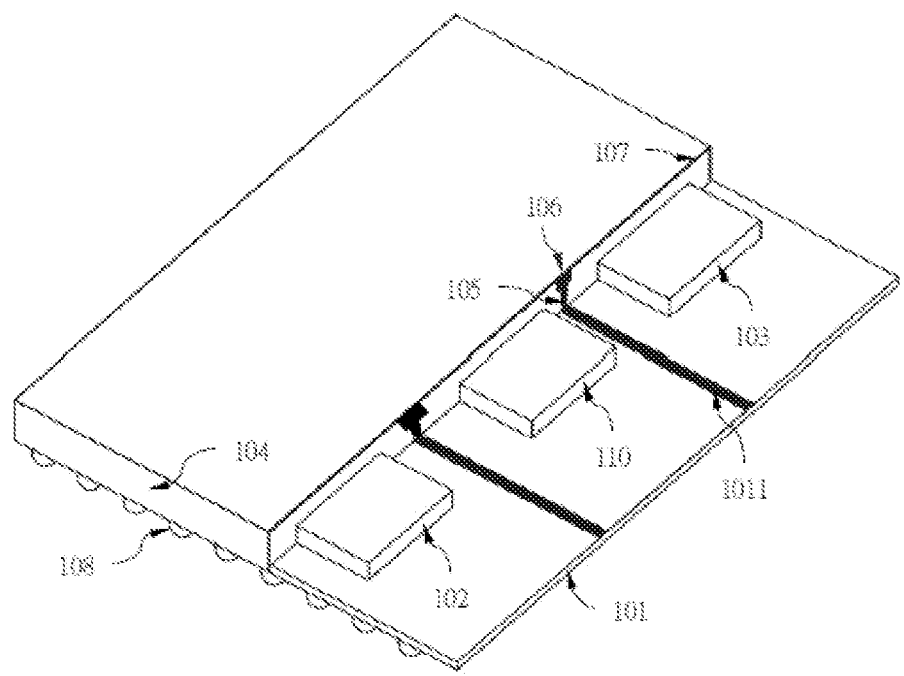
FIGS. 12A and 12B are perspective structural diagrams of still another package structure provided in one embodiment of the invention.
Figure 12B:
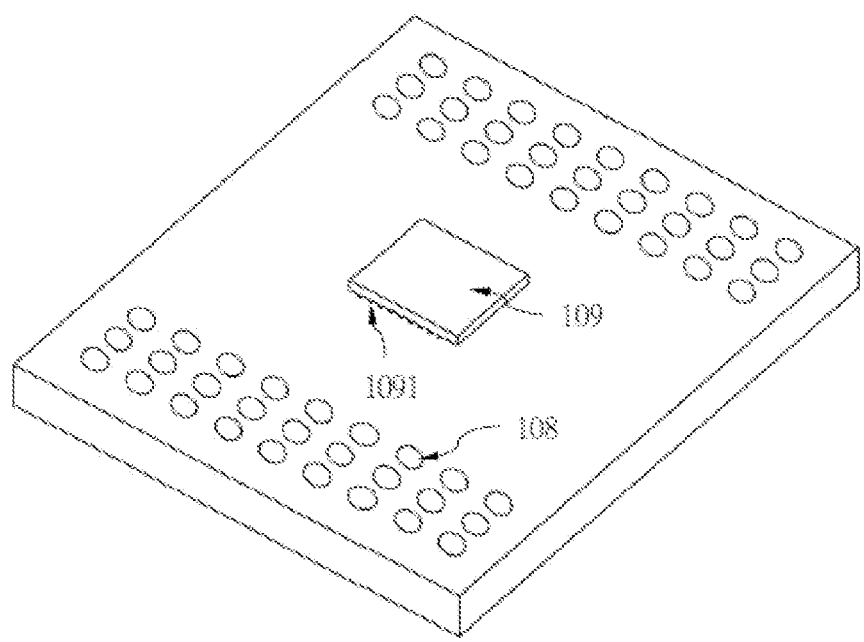
Figure 13:
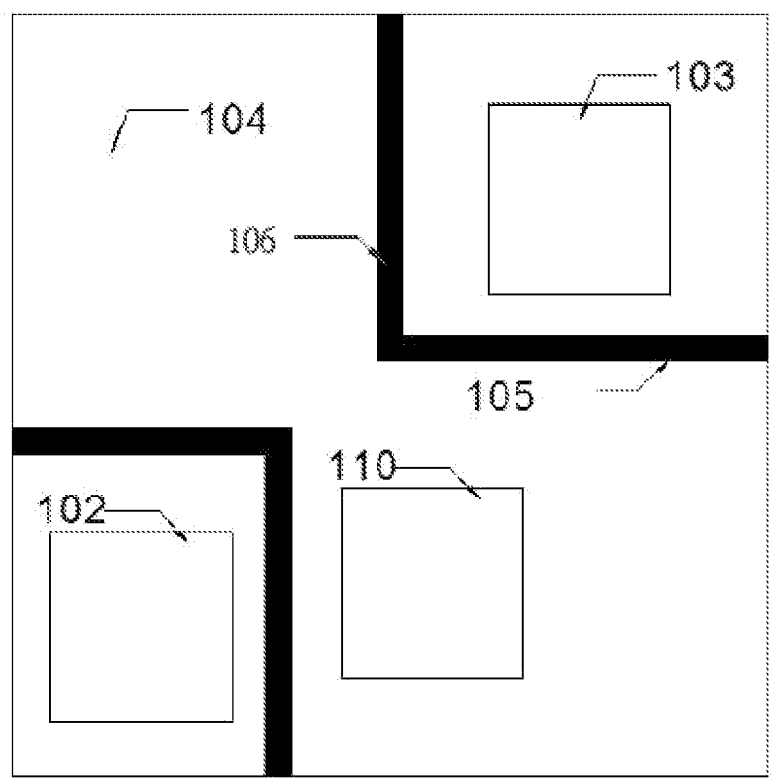
FIG. 13 is a top diagram of still another package structure provided in one embodiment of the invention.

FIG. 11 is a structural diagram illustrating a local section of still another package structure provided in one embodiment of the invention, FIGS. 12A and 12B are perspective structural diagrams of still another package structure provided in one embodiment of the invention, and FIG. 13 is a top diagram of still another package structure provided in one embodiment of the invention.

Difference between a package structure 100" shown in FIGS. 11, 12A, 12B and 13 and the package structure 100 shown in FIGS. 1, 2A, 2B and 3 lies in that the package structure 100" further comprises a radio frequency chip module 110, and other portions are consistent. In this embodiment, the substrate 101 is further disposed with a radio frequency chip module 110 between the radio frequency chip module 102 and the radio frequency chip module 103. Of course, positions of the radio frequency chip module 102, the radio frequency chip module 103 and the radio frequency chip module 110 are not limited. The groove 105 is disposed between the radio frequency chip module 102 and the radio frequency chip module 110, and between the radio frequency chip module 103 and the radio frequency chip module 110, and the solder filling body 106 is disposed in the groove 105, such that the package structure 100" provided in this embodiment can separate the radio frequency chip module 102 and the radio frequency chip module 103 from the radio frequency chip module 110 to shield electromagnetic interference among them.

Figure 14:
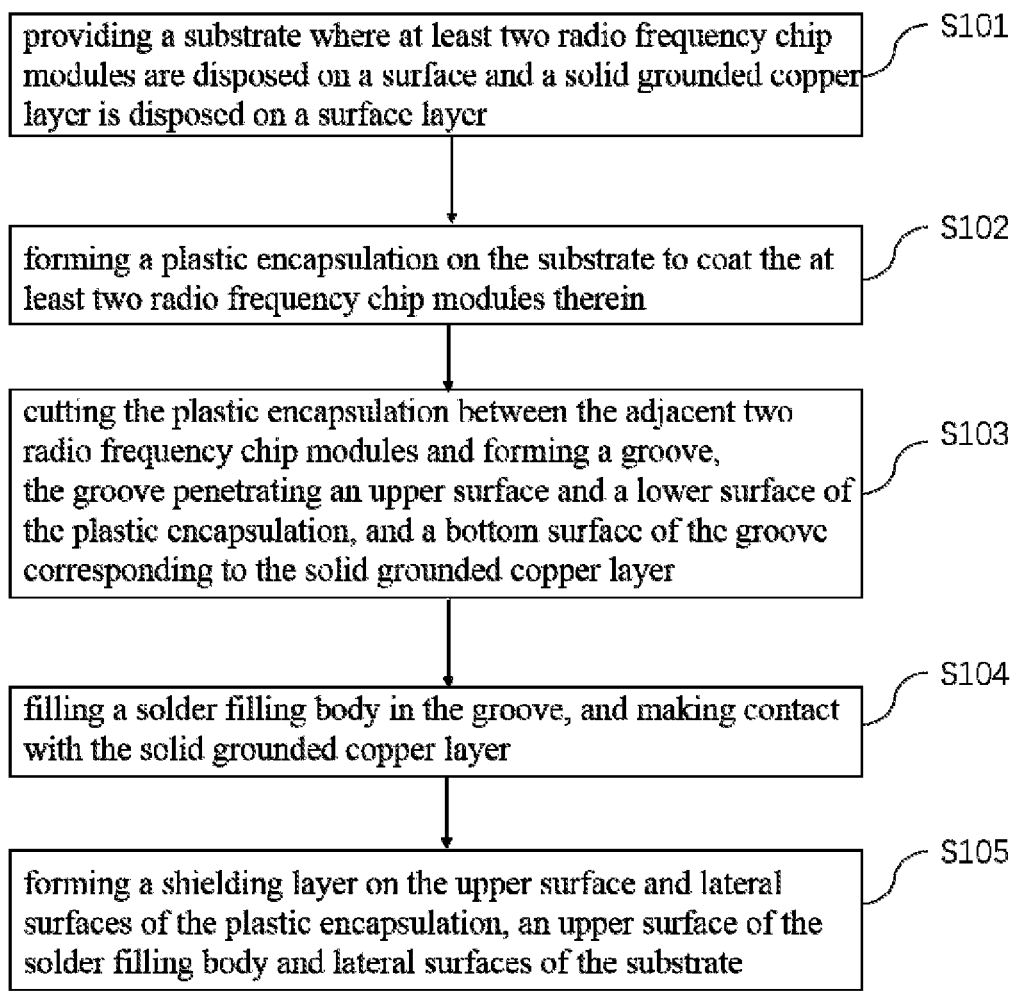
FIG. 14 is a flow diagram illustrating a method of manufacturing a package structure provided in one embodiment of the invention.

FIG. 14 is a flow diagram illustrating a method of manufacturing a package structure provided in one embodiment of the invention, and FIGS. 15A-15G are structural diagrams illustrating processes of the method of manufacturing a package structure provided in one embodiment of the invention.

As shown in FIG. 7, the method of manufacturing a package structure provided in one embodiment of the invention comprises:

S101: providing a substrate 101 where at least two radio frequency chip modules 102, 103 are disposed on a surface and a solid grounded copper layer 1011 is disposed on a surface layer.

Figure 15A:
FIGS. 15A-15G, 16 and 17 are structural diagrams illustrating processes of the method of manufacturing a package structure provided in one embodiment of the invention.
Figure 15B:

Please also refer to FIGS. 15A and 15B, the solid grounded copper layer 1011 (not shown) is disposed on a surface layer of the substrate 101, and the radio frequency chip module 102 and the radio frequency chip module 103 are gold wire bonded and welded to the surface of the substrate 101 through a flip-chip welding technology or a surface mounted technology.

The substrate 101 is designed to have multiple metal circuit layers and a complete ground plane layer to facilitate separating signal interference of a vertical plane. The solid grounded copper layer 1011 is disposed on the surface layer of the substrate 101, and is made of copper, for the purpose of making contact with the solder filling body 106 in subsequent manufacturing process to form a metal separating wall. Alternatively, an upper surface of the solid grounded copper layer 1011 can be covered with a solder mask for insulation protection, or is directly electroplated for protection, or protected by an anti-oxidation film to prevent the copper layer from being exposed and oxidized when the substrate is processed. The substrate 101 is selected from a rigid organic laminated multilayer sheet material, and the metal layers of the substrate 101 are laminated ten to twelve layers.

S102: forming a plastic encapsulation 104 on the substrate 101 to coat the at least two radio frequency chip modules 102, 103 therein.

Figure 15C:
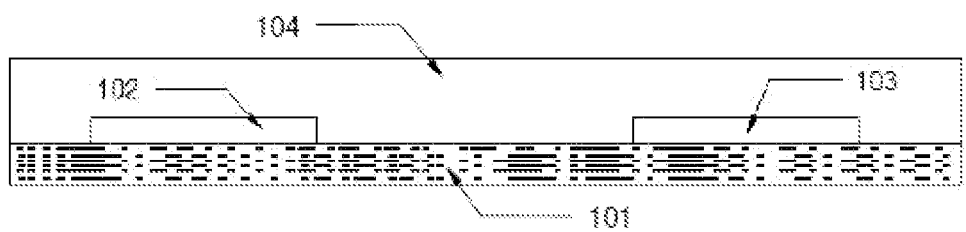

Please also refer to FIG. 15C, the plastic encapsulation 104 is formed after thermoplastic curing a plastic encapsulation material on an entire surface of the substrate 101 through a plastic encapsulation technology. Alternatively, the plastic encapsulation material forming the plastic encapsulation 104 is selected from an insulated thermosetting material with a relatively low viscosity.

S103: cutting the plastic encapsulation 104 between the adjacent two radio frequency chip modules 102, 103 and forming a groove 105, the groove 105 penetrating an upper surface and a lower surface of the plastic encapsulation 104, and a bottom surface of the groove 105 corresponding to the solid grounded copper layer 1011.

Figure 15D:
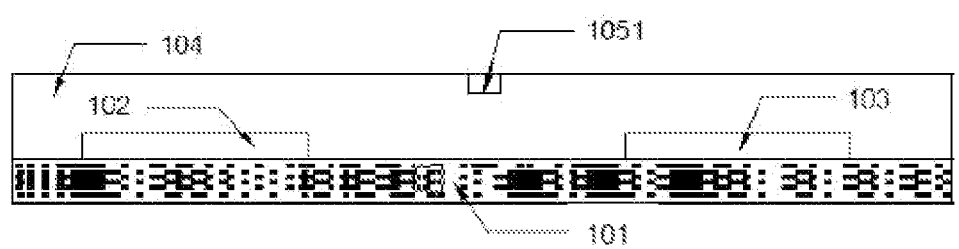
Figure 15E:
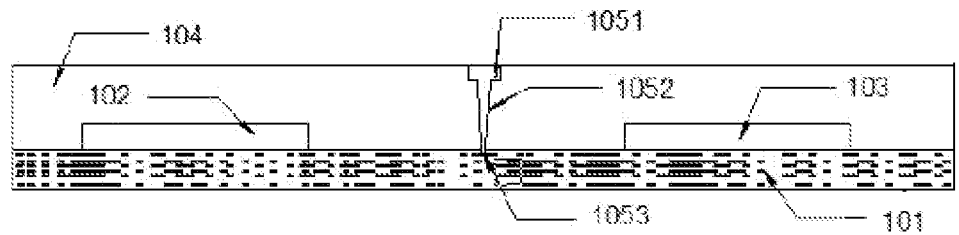

Please also refer to FIGS. 15D and 15E, a relatively wide groove top surface 1051 with a certain depth is formed at a specified position of the plastic encapsulation 104, i.e., between the radio frequency chip module 102 and the radio frequency chip module 103 through a laser technology, then a gradually narrowed groove wall surface 1052 is continued to be formed downwardly, and finally, a groove bottom surface 1053 is formed after reaching the solid grounded copper layer 1011 on the surface layer of the substrate 101. The groove top surface 1051, the groove wall surface 1052 and the groove bottom surface 1053 together form the groove 105.

Specifically, a width of the groove bottom surface 1053 is designed to be greater than or equal to 50 µm, and a width of the groove bottom surface 1053 is at least 50 µm less than the width of the solid grounded copper layer 1011. That is, correspondingly, the width of the solid grounded copper layer 1011 shall be designed to be greater than or equal to 100 µm, a width of the groove top surface 1051 is designed to be three to six times of the width of the groove bottom surface 1053, and a depth of the groove wall surface 1052 is designed to be 50% or more of a depth of the whole groove 105.

S104: filling a solder filling body 106 in the groove 105, and making contact with the solid grounded copper layer 1011.

Figure 15F:
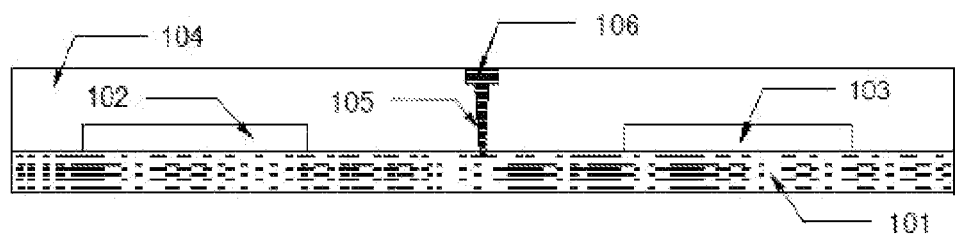

Please also refer to FIG. 15F, a solder filling material is filled in the groove 105 to form the solder filling body 106. Specifically, an upper surface of the solder filling body 106 is flushed with the upper surface of the plastic encapsulation 104, so as to facilitate flatness of a shielding layer 107 in subsequent manufacturing process.

The main component of the solder filling body 106 is a silver powder shielding material, such that the solder filling body 106 makes contact with the solid grounded copper layer 1011 through the groove bottom surface 1053 to form a metal separating wall, i.e., the silver powder shielding material is bonded with a copper material to form a metal separating wall, so a position of the solder filling body 106 corresponds to a position of the solid grounded copper layer 1011, i.e., the groove bottom surface 1053 corresponds to the position of the solid grounded copper layer 1011.

S105: forming a shielding layer 107 on the upper surface and lateral surfaces of the plastic encapsulation 104, an upper surface of the solder filling body 106 and lateral surfaces of the substrate 101.

Figure 15G:
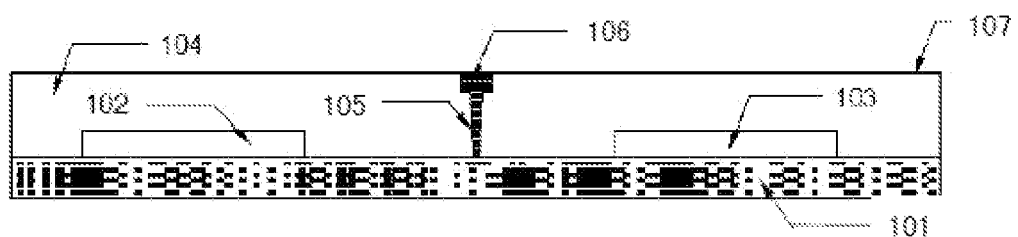

Please also refer to FIG. 15G, a shielding layer 107 is formed on the upper surface and lateral surfaces of the plastic encapsulation 104, an upper surface of the solder filling body 106 and lateral surfaces of the substrate 101 through a sputtering technology. Alternatively, the shielding layer 107 is made of a metal material, and has a thickness of 2 to 10 μm FIGS. 16 and 17 are structural diagrams illustrating processes of the method of manufacturing a package structure provided in one embodiment of the invention.

Figure 16:
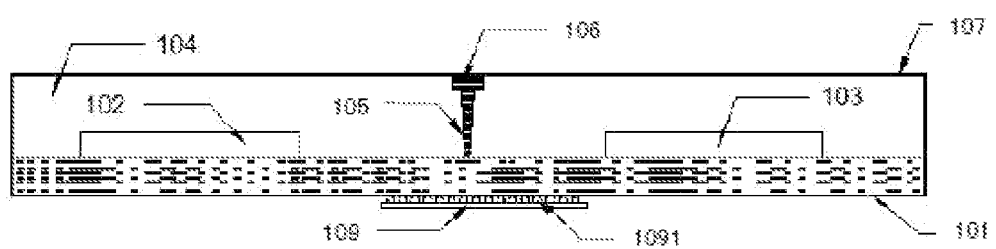

As shown in FIG. 16, on the basis of the manufacturing method in the embodiment, it may further comprise: disposing a communication chip module 109 on the substrate 101. Specifically, the communication chip module 109 is attached to another surface of the substrate 101, i.e., a different surface of the substrate 101 opposite to the radio frequency chip module 102 and the radio frequency chip module 103. Moreover, the communication chip module 109 is disposed on the substrate 101 through micro-solder balls 1091 using interconnection of flip-chip welding or surface mounted welding. Meanwhile, a height of the communication chip module 109 is less than or equal to 200 μm.

Figure 17:
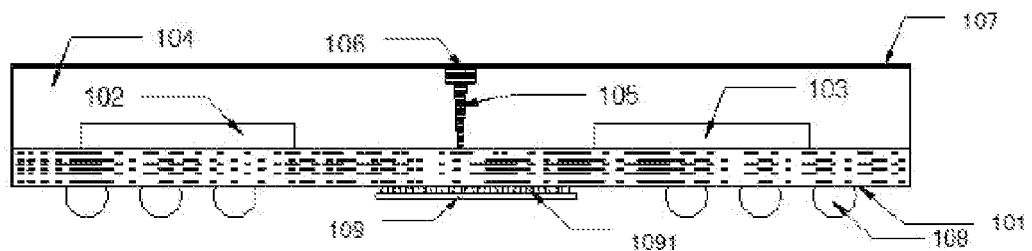

As shown in FIG. 17, on the basis of the manufacturing method in the embodiment, it may further comprise: disposing a plurality of solder balls 108 on the substrate 101. Specifically, the plurality of solder balls 108 are welded to another surface of the substrate 101 through a bumping technology to form an interconnected interface, i.e., a different surface of the substrate 101 opposite to the radio frequency chip module 102 and the radio frequency chip module 103. The plurality of solder balls 108 are located on both sides of the communication chip module 109, and a height of the solder balls 108 is at least 50 μm greater than the height of the communication chip module 109.

Of course, the invention also may have various other embodiments, and those skilled in the art shall make various corresponding modifications and variations according to the invention without departing from spirit and essence of the invention, but these corresponding modifications and variations shall belong to the scope protected by the appended claims of the invention.

What is claimed is:

1. A package structure, comprising:
   a substrate disposed with a solid grounded copper layer on a surface layer;
   at least two radio frequency chip modules disposed on the substrate;
   a plastic encapsulation disposed on the substrate and coating the at least two radio frequency chip modules;
   a groove penetrating an upper surface and a lower surface of the plastic encapsulation and located between the adjacent two radio frequency chip modules;
   a solder filling body filled in the groove; and
   a shielding layer covered on the upper surface and lateral surfaces of the plastic encapsulation, an upper surface of the solder filling body and lateral surfaces of the substrate;
   wherein the solid grounded copper layer corresponds to a bottom surface of the groove, and makes contact with the solder filling body, and
   wherein the groove comprises a groove top surface, a groove wall surface and a groove bottom surface, a width of the solid grounded copper layer is greater than or equal to 100 μm, a width of the groove bottom surface is greater than or equal to 50 μm, a width of the groove top surface is three to six times of the width of the groove bottom surface, and a ratio of a depth of the groove wall surface to a depth of the groove is greater than or equal to 50%.

2. The package structure according to claim 1, wherein the substrate is made of a rigid organic laminated multilayer sheet material, and has multiple metal circuit layers and a complete ground plane layer.

3. The package structure according to claim 2, wherein the metal circuit layers of the substrate are laminated ten to twelve layers.

4. The package structure according to claim 1, wherein the plastic encapsulation is made of an insulated thermosetting material with a relatively low viscosity.

5. The package structure according to claim 1, wherein the solid grounded copper layer is made of copper, the solder filling body is made of a silver-based material, and a contact portion therebetween forms a metal separating wall.

6. The package structure according to claim 1, wherein the upper surface of the plastic encapsulation is flushed with the upper surface of the solder filling body.

7. The package structure according to claim 1, wherein a thickness of the shielding layer is 2 to 10 μm.

8. The package structure according to claim 1, further comprising:
   a communication chip module disposed on the substrate.

9. The package structure according to claim 8, wherein a height of the communication chip module is less than or equal to 200 μm.

10. The package structure according to claim 8, wherein the communication chip module is located on a different side of the substrate opposite to the at least two radio frequency chip modules, and attached to the substrate through a plurality of micro-solder balls.

11. The package structure according to claim 8, wherein the communication chip module and the at least two radio frequency chip modules are located on the same side of the substrate, and directly attached to the substrate, and the communication chip module is not coated by the plastic encapsulation.

12. The package structure according to claim 1, further comprising:
   a plurality of solder balls disposed on the substrate, and located on a different side of the substrate opposite to the at least two radio frequency chip modules.

* * * * *